United States Patent [19]

Beigel et al.

[11] Patent Number: 5,637,901
[45] Date of Patent: *Jun. 10, 1997

[54] INTEGRATED CIRCUIT WITH DIODE-CONNECTED TRANSISTOR FOR REDUCING ESD DAMAGE

[75] Inventors: David F. Beigel, Swampscott; Edward L. Wolfe; William A. Krieger, both of North Andover, all of Mass.

[73] Assignee: Analog Devices, Inc., Norwood, Mass.

[*] Notice: The term of this patent shall not extend beyond the expiration date of Pat. No. 5,446,302.

[21] Appl. No.: 468,250

[22] Filed: Jun. 6, 1995

Related U.S. Application Data

[62] Division of Ser. No. 166,636, Dec. 14, 1993, Pat. No. 5,446,302.
[51] Int. Cl.⁶ .................................................. H01L 29/06
[52] U.S. Cl. ........................... 257/355; 257/362; 257/506; 257/565; 257/586
[58] Field of Search ................................. 257/355–363, 257/506, 565, 586, 587, 588

[56] References Cited

U.S. PATENT DOCUMENTS

| | | | |
|---|---|---|---|
| 3,740,835 | 6/1973 | Duncan | 257/771 |
| 4,100,561 | 7/1978 | Ollendorf | 257/362 |
| 4,295,266 | 10/1981 | Hsu | 257/369 |

*Primary Examiner*—J. Carroll
*Attorney, Agent, or Firm*—Parmelee & Bollinger, LLP

[57] ABSTRACT

A diode-connected transistor device for IC protection against electrostatic discharge (ESD) that functions as a transistor in the active region during an ESD event. The device cell includes an annular collector at the outer reaches of the cell, a circular base diffusion concentric with the collector, and an annular emitter near the outer edge of the base. The base and emitter regions are connected together by metallization external to the transistor cell. With the base contact enclosed by the annular emitter, during an ESD spike the initial reverse bias current flow is from the collector, under the emitter diffusion and out of the base contact. Eventually, as the magnitude of the ESD spike increases, the reverse biased current becomes sufficient to locally forward bias the base-emitter junction changing the primary ESD current path from collector to base, to collector to emitter, thus lowering the ESD current density in the active base-collector junction. Hence, the active emitter area is significantly increased with only a small increase in transistor area, resulting in reduced power density and joule heating, and increased overall ESD tolerance without significant change in parasitic capacitance.

5 Claims, 4 Drawing Sheets

SYMBOLIC REPRESENTATIONS OF
BIPOLAR TRANSISTOR ESD DEVICES
CONFIGURED AS TWO TERMINAL DEVICES.

INTEGRATED CIRCUIT WITH DIODE-CONNECTED TRANSISTOR FOR REDUCING ESD DAMAGE

This application is a divisional application of application Ser. No. 08/166,636 as originally filed on Dec. 14, 1993 U.S. Pat. No. 5,446,302.

BACKGROUND OF THE INVENTION

1. Field of the Invention

This invention relates to the means of reducing ESD damage to integrated circuits (ICs) comprising a substrate carrying a large number of circuit elements such as transistors and the like.

2. Prior Art

It is well known that ICs are subject to serious damage or destruction as a result of Electrostatic Discharge (ESD) events. The electrostatic charge can be developed by any of many sources, such as lightning, friction between insulating bodies such as synthetic fiber clothing, and contact with chip handling apparatus. Damage occurs when the ESD charge is accidentally coupled to one of the circuit terminal points to cause a large pulse of current to flow through some portion of the metal interconnect of the chip to a sensitive circuit element of the IC. Frequently, such current pulses will destroy the circuit element and with it the entire IC chip.

Bipolar junctions, dielectrics and thin film circuit elements (i.e., thin film resistors, diffused resistors, dielectric isolations, oxide capacitors) are especially subject to damage from ESD transients of relatively high energy. Such ESD transients can be simulated by the so-called Human Body Model (HBM), Machine Model (MM) and Charged Device Model (CDM).

Various devices have been employed to prevent damage to ICs from ESD events. For example, individual circuit elements often are protected by additional devices which shunt the ESD energy and thereby protect the element in question. In general, a separate shunt device must be provided for each element requiring protection (although in some cases the protection device may be shared by more than one element requiring protection). In any event, providing protection devices to prevent damage from ESD events requires additional IC area and typically produces some harmful side effects such as additional parasitic capacitance which slows down the response time of the circuitry. It is very desirable to reduce the impact of these detrimental consequences resulting from the use of ESD protective devices. Additionally, to fabricate the ESD device, it is desirable to use standard fabrication sequences which are monitored and controlled by statistical means.

SUMMARY OF THE INVENTION

In a preferred embodiment of the invention, to be described hereinbelow in detail, there is provided a high-performance ESD clamp device formed as part of the IC chip and connected to terminal points (such as bond pads) of the chip to shunt destructive ESD energy away from sensitive die circuitry. This embodiment comprises a diode-connected vertical bipolar transistor having a collector-emitter-base layout configuration, with circular and annular topographies. The two terminal, diode connected bipolar transistor ESD device is formed by externally connecting the base and emitter together with die metallization. A symbolic representation can be found in FIG. 1.

This two terminal clamp device is arranged to be connected between supply rails, ground, or any other circuit nodes. That is, the clamp device is connected as a shunt element and formed to withstand large power transients such as encountered during an ESD event between the external terminal point (bond pad and package pin) and sensitive circuitry to be protected. When an electrostatic pulse of large energy strikes the chip pin, the clamp device conducts to shunt the ESD energy away from sensitive circuitry. Thus the ESD energy is dissipated so as to avoid damaging any sensitive circuit elements connected to the external terminal point.

One feature of this ESD clamp device is its improved capability to conduct current vertically from emitter to collector identical to a bipolar transistor in the active mode. This result is accomplished by the position of the emitter which encloses the base contact. Further features comprise circular and annular topographies which eliminate high electric field concentrations and distribute current more evenly throughout the device.

By incorporating these features (as compared for example to traditional rectangular topographies and positioning of collector-base-emitter), the active emitter area is increased significantly with only a small increase in transistor area. This gives an important reduction in power density during an ESD event, thus reducing local joule heating and increasing the overall ESD tolerance. Because there is only a small increase in area, the parasitic capacitance is virtually unchanged as compared to non-annular, non-circular clamping devices.

Other objects, aspects and advantages of the invention will in part be pointed out in and in part apparent from the following detailed description of a preferred embodiment of the invention, considered together with the accompanying drawings.

DETAILED DESCRIPTION OF A PREFERRED EMBODIMENT

Figure 2:
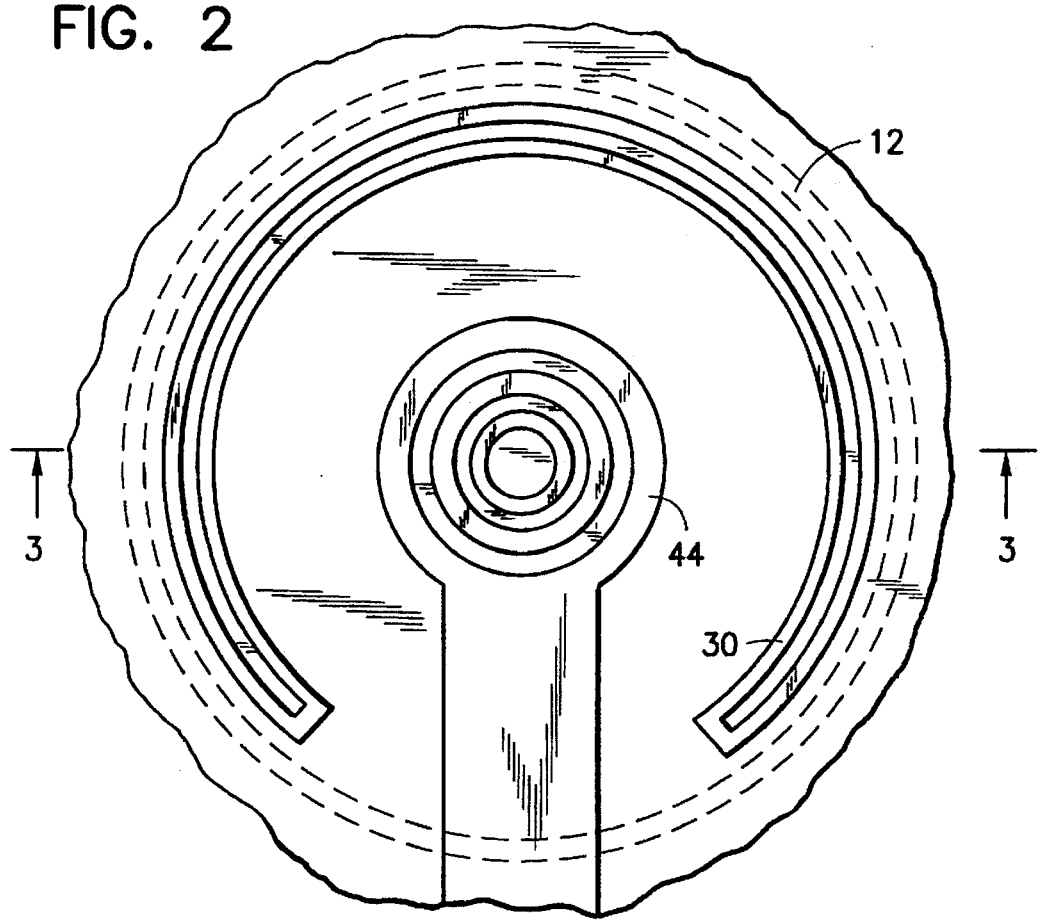
FIG. 2 is a plan view of an IC cell comprising an ESD clamp device in accordance with the present invention.
Figure 3:
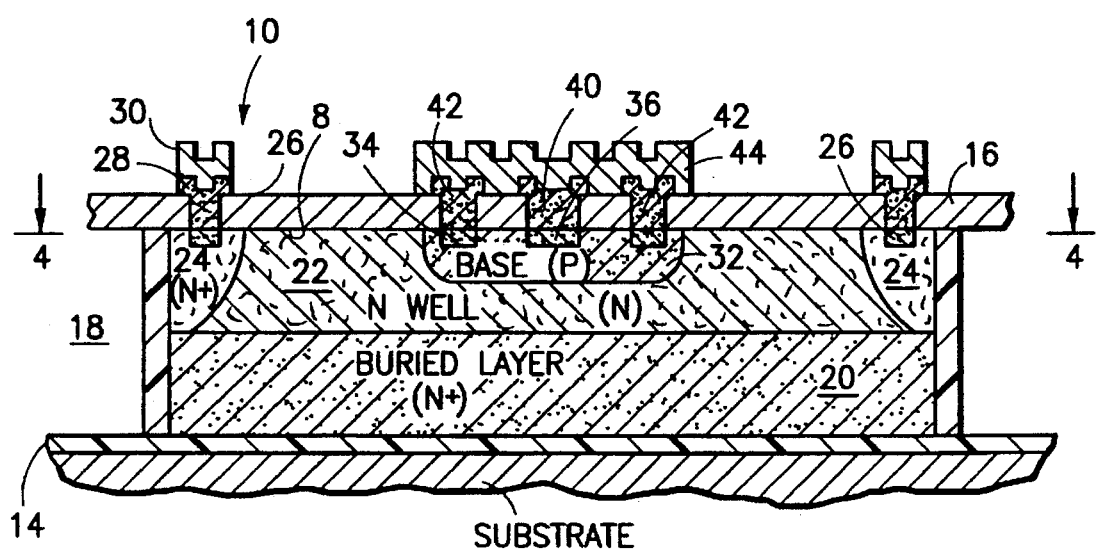
FIG. 3 is a cross-section view of the cell taken along line 3—3 of FIG. 2.
Figure 4:
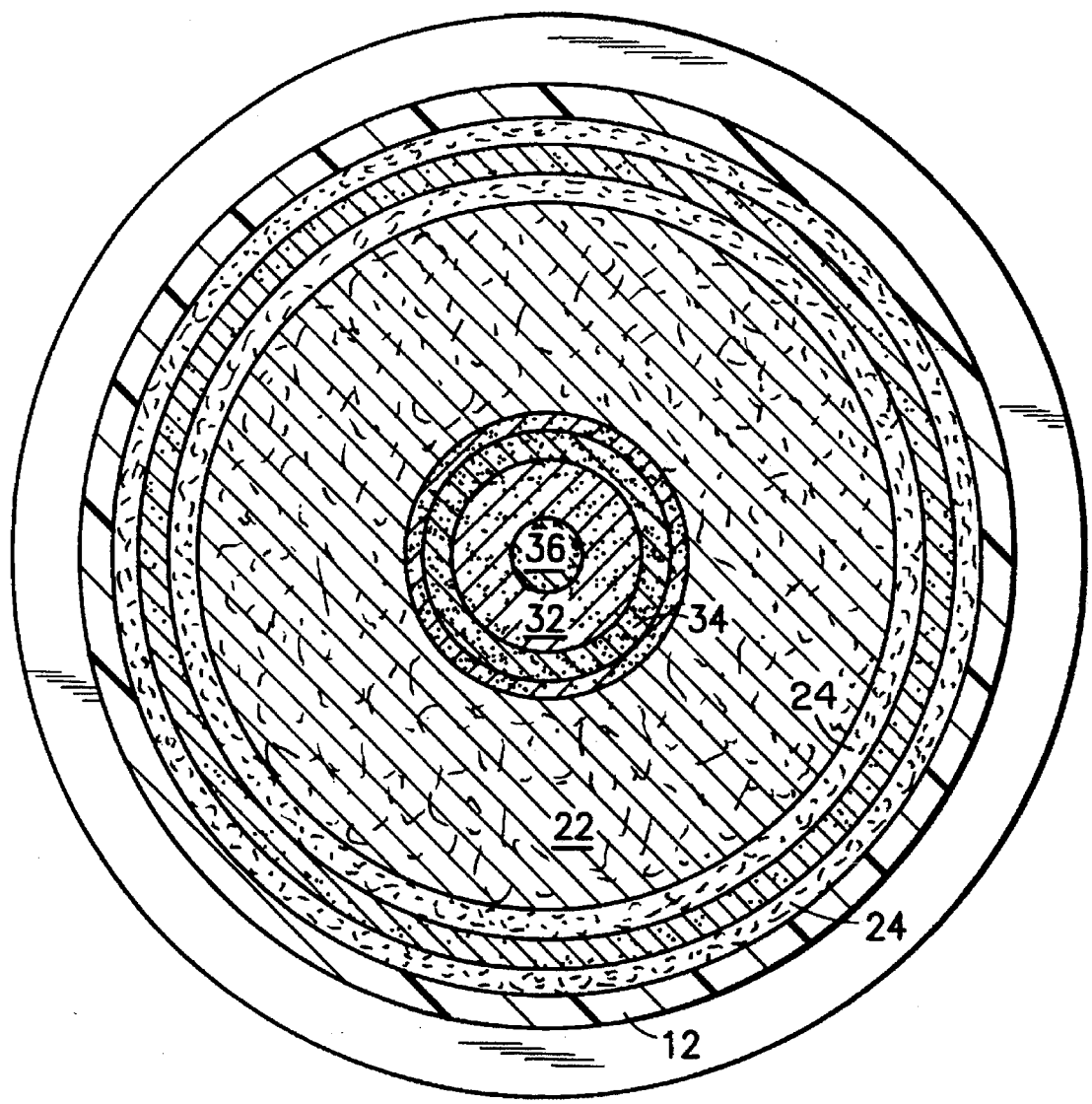
FIG. 4 is a horizontal section of the cell taken along line 4—4 of FIG. 3.

Turning first to FIGS. 2 and 3, the ESD clamp is a circular cell generally identified at 10 which is a vertical NPN transistor. Surrounding this cell are other cells of the IC (not shown) formed with devices such as but not limited to transistors, capacitors and resistors. The interior of the cell 10 comprises silicon isolated from the rest of the chip by dielectric material.

More specifically, the outermost region of the ESD cell 10 is a dielectrically filled deep trench 12 which functions as electrical isolation for the cell. The trench 12 circumscribes the ESD cell and extends from the upper silicon surface 8 to the buried oxide layer 14. The bottom of the cell is defined by the oxide insulation layer 14 (buried oxide) which is between the lower surface of N-type silicon (to be described) and the upper surface of a P-type silicon substrate (not completely shown), and which sometimes is referred to as the "handle" of the chip. The upper surface of the cell is formed of silicon dioxide 16 for the chip. The regions 18 outside of the trench typically are tied to a supply rail of the chip and are designated as non-active circuit areas.

The collector region of the ESD cell is comprised of four different diffusions of N-type dopant. They are: a buried layer 20, a deep plug 24, an N-well 22, and a shallow N++ region 26. The buried layer 20 is a heavily doped region of relatively low resistance which comprises the bottommost electrically active layer of the transistor. The buried layer 20 extends throughout the ESD cell to the edge of the deep trench 12. An annular ring of deep plug 24 extends from the silicon surface 8 to the buried layer 20 with its outermost edge abutting the edge of the trench 12.

The inner edge of the deep plug annulus 24 is spaced sufficiently far from the base region 32 of the transistor to assure an adequate breakdown potential of the collector to base junction. Electrical contact to the collector is made through the surface dielectric 16 to an annular-shaped (but not completely closed) highly doped n++ layer 26 concentric with and contained within the deep plug annulus 24.

The base 32 of the transistor is circular shaped and concentric with the collector plug annulus. The base 32 is made of P-type dopant (opposite that of the collector) and extends from the silicon surface 8 to a depth that is spaced sufficiently far from the buried layer 20 to assure an adequate breakdown potential between the collector to base regions, and between the collector to emitter regions.

Electrical contact to the base region 32 is made through the surface dielectric 16 to a circular shaped region of a highly doped P++ layer 36 which is concentric to the base 32. The P++ layer 36 assures good electrical contact to the base region 32 and is constrained on all sides by the base layer 32.

The emitter 34 is a heavily doped N-type layer of annular shape, concentric to the base 32, with its inner edge spaced sufficiently far away from the highly doped P++ layer 36 to assure adequate breakdown potential of the emitter to base junction. The outer edge of the emitter annulus 34 is located within the base region 32 and spaced sufficiently far from the edge of the base to assure adequate electrical breakdown between the emitter to collector junction. Electrical contact to the emitter 34 is made through the surface dielectric 16.

The region of silicon 22 surrounding the base 32 and located between the collector plug regions 24 and the buried layer 20 is lightly doped N-type (N-well). The N-well is formed by counter doping the P-type epitaxial layer.

The electrical contacts to the emitter 34 and collector 26 are made through openings in the surface dielectric 16 filled with polycrystalline silicon 42, 28 highly doped N-type. Electrical contact to the base region 36 is made through an opening in the surface dielectric 16 filled with polycrystalline silicon 40 of highly doped P-type. The polycrystalline silicon layers 42, 28, 40 provide good ohmic contact and low resistance between the chip metallization 30, 44 and the silicon surface of the transistor. Above and directly in contact with the polycrystalline silicon layers 42, 28, 40 is chip metallization 30, 44 (e.g., aluminum-copper) providing for external connections.

It will be seen that with this geometrical configuration, with the emitter region 34 entirely enclosing the centrally located base contact 36, 40, vertical bipolar transistor current conduction occurs during an ESD event (current conduction from emitter to collector 24). This configuration provides the important benefit of increasing the effective current conducting area of the emitter relative to standard rectangular emitter striped transistors. Thus, the localized power density for the device is significantly lower than that of the standard rectangular/emitter striped transistors.

Figure 1:
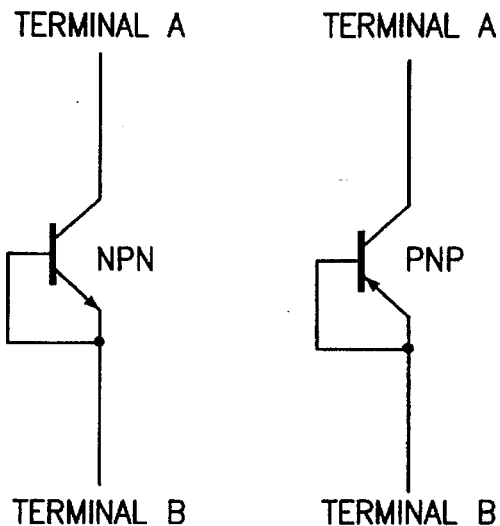
FIG. 1 shows symbolic representations of bipolar transistor ESD devices configured as two terminal devices.
Figure 5:
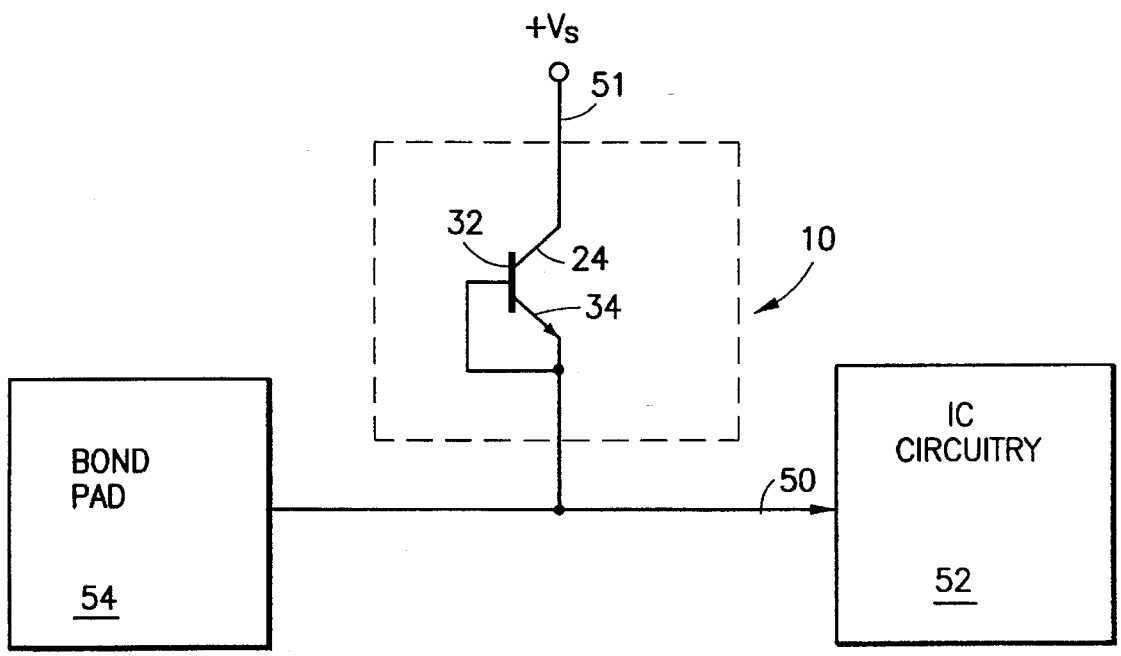
FIG. 5 is a circuit diagram showing the preferred embodiment a clamp device connected in shunt fashion between a bond pad and the IC circuitry to be protected from ESD pulses.

In the preferred embodiment as shown in FIG. 5, the common base-emitter regions 32, 34 of the clamp device 10 are connected to the lead 50 extending from sensitive integrated circuitry 52 to a bond pad 54 of the chip. Bond pad 54 is the interface between the IC chip and the external world. The collector 24 of the clamp device is connected to the most positive potential which in this embodiment is a power supply rail designated $+V_s$, and serving as a low impedance bus for the clamp device. When an electrostatic pulse strikes the bond pad, the energy travelling along the connection lead 50 is shunted by the clamp device to the supply rail so as to limit the voltage and current received by the circuitry 52 and preventing damage to that circuitry.

Figure 6:
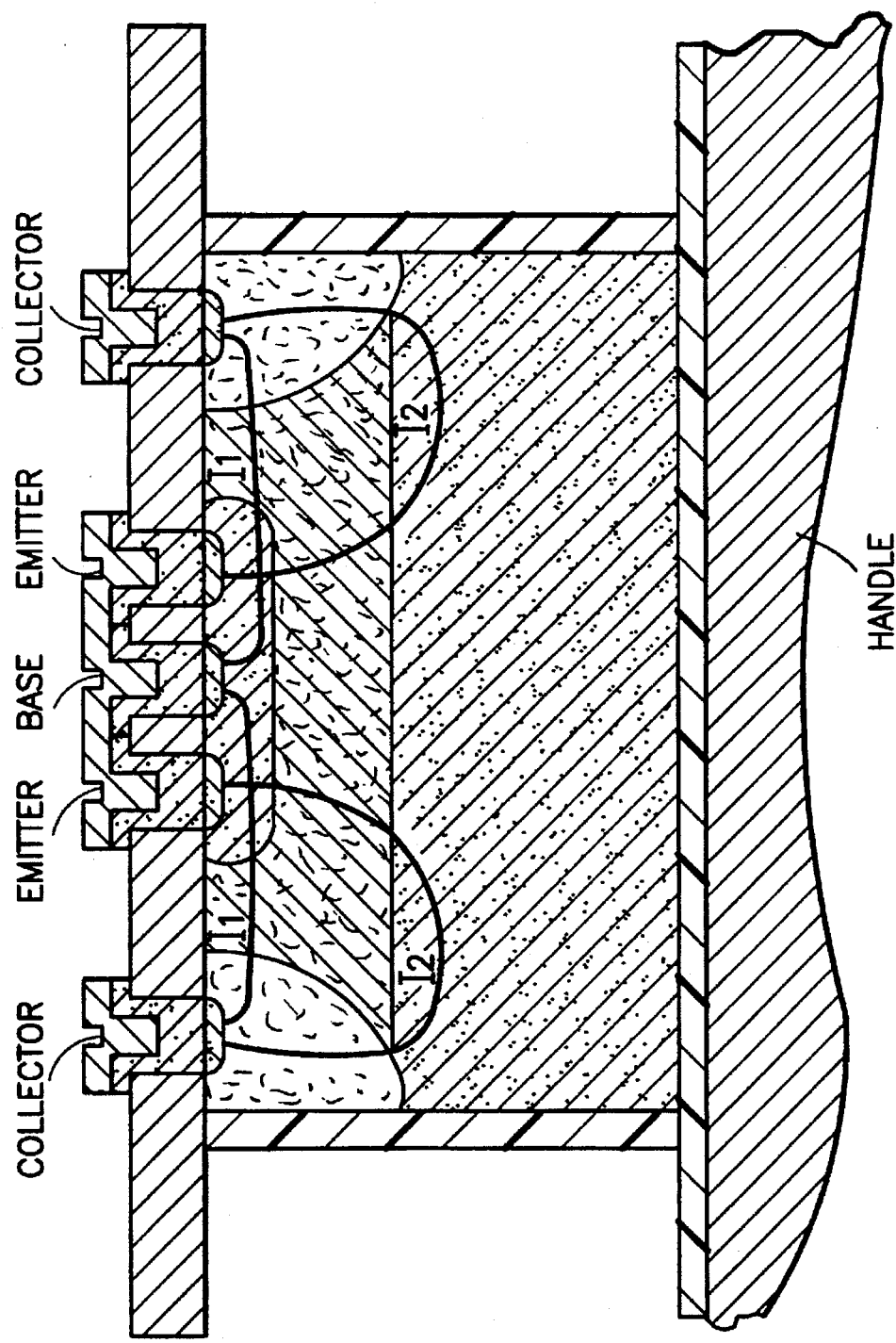
FIG. 6 is a cut-away diagram showing, partly in perspective, current paths during reverse-bias operation.

In the preferred embodiment, when a negative ESD spike reaches the clamp device as in FIG. 5, a positive polarity from the collector (+) to the emitter-base (−) occurs. The base-collector becomes reverse biased and eventually goes into avalanche breakdown, conducting the avalanche current in path $I_1$ as shown in FIG. 6. As theorized as the current $I_1$ increases with respect to the increasing magnitude of the ESD spike, the lateral voltage drop in the base ($R_b \times I_1$) develops a localized forward bias potential of the emitter and base junction in the base region pinched between the emitter and N-well layer diffusions. This localized forward bias junction induces current conduction between the emitter and collector such as a bipolar transistor conducting in the active mode. Once the voltage and current from the ESD spike has been shunted and dissipated, the clamp devices' current conduction from collector to emitter-base turns off and the clamp functions as a reverse biased diode.

ESD failures in the semiconductor material are thermally related and proportional to the localized power density in the device. Failures predominately occur in reverse-biased junctions where the power density is equal to the electric field across the junction multiplied by the current density in that semiconductor region. Traditional ESD clamps rely on current flows similar to $I_1$ alone; hence large topographical areas are needed to reduce current density to increase the ESD threshold. In comparing the current density of each path ($I_1$, $I_2$), the area in current path $I_2$ is approximately the topographic area of the emitter diffusion ($A_e$), whereas the area in current path $I_1$ is approximated by the topographical circumference of the base diffusion ($C_{base}$) multiplied by the base junction depth ($X_{jb}$). In most IC chips junction depth is typically much less than emitter drawn feature size. Therefore for the same size transistor:

$A_e \gg X_{jb} \times C_{base}$ and;

Current density ($I_2$) $\ll$ Current density ($I_1$) where $I_2/A_e$ = Current density due to $I_2$ and ($X_{jb} \times C_{base}$)=current density due to $I_1$.

For the same ESD event, the circular and annular topographies of the disclosed device provide for a more uniform and reduced current density compared to more traditional rectangular striped configurations.

The ESD protection circuit of the disclosed device also protects against ESD induced spikes of positive polarity. Suppose that a positive voltage spike generated by an ESD impinges across wire-bonding pad 50 and power supply conductor 51 as in FIG. 5. In this case, the potential at the wire bonding pad 50 is more positive than the potential at power supply conductor 51. Transistor 10 responds swiftly with its base-collector junction forward biasing conducting current laterally from base 32 to collector 24 in a manner similar to current $I_1$ shown in FIG. 6, but in an opposite direction. In this case, the voltage across the base-emitter junction is a normal diode drop which is about 0.6 Volt in the preferred embodiment. Power, which is equal to the product of voltage and current, is small in this case. The lateral current flow consequently does not result in excessive localized heating, hence large ESD thresholds are obtained.

Under normal IC chip operation, the ESD clamp functions as a reverse-biased diode. The low parasitic capacitance, low leakage current, and compact geometric area of the ESD clamp are important advantageous features of ESD clamps for high speed applications.

Although a preferred embodiment of the invention has been disclosed herein in detail, it is to be understood that this is for the purpose of illustrating the invention, and should not be construed as necessarily limiting the scope of the invention since it is apparent that many changes can be made by those skilled in the art while still practicing the invention claimed herein.

What is claimed is:

1. An integrated-circuit (IC) chip comprising circuitry including elements such as transistors, capacitors or resistors, said circuitry being connected by a lead to an external terminal point of said IC chip, said IC chip further being formed with a clamp device to reduce damage to at least one of said elements of said circuitry from electrostatic discharge (ESD) striking said terminal point, said clamp device being formed during the formation of said circuit elements of the chip and including:

a cell comprising semiconductive material having contiguous upper and lower segments;

said upper and lower cell segments having top and bottom surfaces respectively and having side surfaces extending around said cell;

electrical isolation means surrounding said cell at said top, bottom and side surfaces thereof;

a vertical bipolar transistor formed in said cell and comprising:

a first region of semiconductor material in said upper cell segment formed with dopant of one type and having an upper surface in contact with the electrical isolation means at said top surface;

said first region serving at least as part of a collector for said vertical bipolar transistor;

a second region of semiconductive material in said upper cell segment having dopant of type opposite said one type and located adjacent said top surface to serve as the base of said bipolar transistor with an upper surface of said second region in contact with the electrical isolation means at said top surface;

said second region being spaced from said side surfaces of said cell with said first region positioned between said second region and said side surfaces in at least certain sectors thereof;

base contact means comprising semiconductor material of said upper segment located interiorly of said base region, said base contact means being formed with dopant of said opposite type to establish a contact for making electrical connection to said base;

an emitter in said base region with dopant of said one type and formed to enclose said base contact means in a plane parallel to said top surface;

said emitter being spaced from said base contact means such that part of said base region is between said base contact means and said emitter;

means conductively connecting said base contact means and said emitter;

means to establish a contact for said region functioning as a collector;

means connecting one of said contacts to a low-impedance bus; and means connecting the other of said contacts to said lead between said terminal point and said IC circuitry so as to shunt electrostatic energy received from said terminal point thereby to prevent damage to said IC circuitry.

2. An IC chip as claimed in claim 1, wherein said first region comprises a plug of semiconductive material extending at least part way around said cell adjacent said top surface and said side surfaces.

3. An IC chip as claimed in claim 1, wherein said base is disc-shaped in a plane parallel to said top surface;

said emitter being annular in shape and concentric with said disc-shaped base.

4. An integrated-circuit (IC) chip comprising circuitry including elements such as transistors, capacitors or resistors, said circuitry being connected by a lead to an external terminal point of said IC chip, said IC chip further being formed with a clamp device to reduce damage to at least one of said elements of said circuitry from electrostatic discharge (ESD) striking said terminal point, said clamp device being formed during the formation of said circuit elements of the chip and including:

a cell comprising semiconductive material having contiguous upper and lower segments;

said upper and lower cell segments having top and bottom surfaces respectively and having side surfaces extending around said cell;

electrical isolation means surrounding said cell at said top, bottom and side surfaces thereof;

a vertical bipolar transistor formed in said cell and comprising:

a first region of semiconductor material in said upper cell segment formed with dopant of one type and having an upper surface in contact with the electrical isolation means at said top surface;

said first region serving at least as part of a collector for said vertical bipolar transistor;

a second region of semiconductive material in said upper cell segment having dopant of type opposite said one type and located adjacent said top surface to serve as the base of said bipolar transistor with an upper surface of said second region in contact with the electrical isolation means at said top surface;

said second region being spaced from said side surfaces of said cell with said first region positioned between said second region and said side surfaces in at least certain sectors thereof;

base contact means comprising semiconductor material of said upper segment located interiorly of said base region, said base contact means being formed with dopant of said opposite type to establish a contact for making electrical connection to said base;

an emitter in said base region with dopant of said one type and formed to enclose said base contact means in a plane parallel to said top surface;

said emitter having a curvilinear ring-like configuration with at least portions being curved in enclosing said base contact means in said plane;

means conductively connecting said first base contact means and said emitter;

means to establish a contact for said region functioning as a collector;

means connecting one of said contacts to a low-impedance bus; and means connecting the other of said contacts to said lead between said terminal point and said IC circuitry so as to shunt electrostatic energy received from said terminal point thereby to prevent damage to said IC circuitry.

5. An IC chip as claimed in claim 2, wherein said cell is circular in any cross-section plane parallel to said top surface;

said base being circular with said base contact means at the center thereof;

said emitter being annular-shaped and concentric with said base.

* * * * *